US008737168B2

(12) United States Patent
Somasundaram et al.

(10) Patent No.: US 8,737,168 B2
(45) Date of Patent: May 27, 2014

(54) SYSTEM AND METHOD FOR AUTOMATIC DETERMINATION OF THE PHYSICAL LOCATION OF DATA CENTER EQUIPMENT

(76) Inventors: Siva Somasundaram, Dayton, NJ (US); Naim R. Malik, Somerset, NJ (US); Brian Wang, Xindian (TW)

( * ) Notice: Subject to any disclaimer, the term of this patent is extended or adjusted under 35 U.S.C. 154(b) by 275 days.

(21) Appl. No.: 12/582,480

(22) Filed: Oct. 20, 2009

(65) Prior Publication Data

US 2010/0214873 A1      Aug. 26, 2010

Related U.S. Application Data

(60) Provisional application No. 61/106,900, filed on Oct. 20, 2008.

(51) Int. Cl.
*G01S 15/00* (2006.01)
(52) U.S. Cl.
USPC ........................................... 367/127
(58) Field of Classification Search
USPC ................................. 367/127, 125
See application file for complete search history.

(56) References Cited

U.S. PATENT DOCUMENTS

| | | |
|---|---|---|
| 4,321,582 A | 3/1982 | Banghart |
| 4,543,649 A | 9/1985 | Head |
| 4,955,821 A | 9/1990 | Bernardini |
| 5,515,853 A | 5/1996 | Smith |
| 5,719,800 A | 2/1998 | Mittal et al. |
| 5,964,879 A | 10/1999 | Dunstan et al. |
| 6,167,330 A | 12/2000 | Linderman |
| 6,229,899 B1 | 5/2001 | Norris |
| 6,413,104 B1 | 7/2002 | Bernardini |
| 6,476,728 B1 | 11/2002 | Sakakibara |
| 6,499,102 B1 | 12/2002 | Ewertz |
| 6,553,336 B1 | 4/2003 | Johnson |
| 6,567,769 B2 | 5/2003 | Chang |
| 6,697,300 B1 * | 2/2004 | Holt .............................. 367/127 |
| 6,983,210 B2 | 1/2006 | Matsubayashi |
| 6,985,697 B2 | 1/2006 | Smith et al. |

(Continued)

FOREIGN PATENT DOCUMENTS

| | | |
|---|---|---|
| EP | 0766098 | 4/1997 |
| EP | 1489719 A2 | 12/2004 |

(Continued)

OTHER PUBLICATIONS

The International Search Report and Written Opinion by the International Searching Authority, issued on Dec. 18, 2009, in the PCT application No. PCT/US09/061354.

(Continued)

*Primary Examiner* — Daniel Pihulic

(57) ABSTRACT

The invention is directed to a system and method for automatic discovery of the physical location of at least one device in a data center, the device having an associated ultrasonic emitter. The system generally includes a plurality of ultrasonic detectors having known locations in the data center. A controller initiates the generation of an ultrasonic signal from an ultrasonic emitter associated with a device under test. Time of arrival circuitry generates time of arrival information associated with each ultrasonic detector based on the time of receipt of the ultrasonic signal. The controller determines the location of the device under test based on the known location of the ultrasonic detectors within the data center and the time of arrival information associated with each ultrasonic detector.

26 Claims, 7 Drawing Sheets

(56) References Cited

U.S. PATENT DOCUMENTS

| | | |
|---|---|---|
| 6,986,069 B2 | 1/2006 | Oehler et al. |
| 7,032,119 B2 | 4/2006 | Fung |
| 7,057,557 B2 | 6/2006 | Lee |
| 7,248,978 B2 | 7/2007 | Ransom |
| 7,272,735 B2 | 9/2007 | Fung |
| 7,295,556 B2 | 11/2007 | Roese |
| 7,444,526 B2 | 10/2008 | Felter |
| 7,802,120 B2 | 9/2010 | Conroy et al. |
| 7,853,816 B2 | 12/2010 | Tanaka |
| 2002/0007463 A1 | 1/2002 | Fung |
| 2002/0156600 A1 | 10/2002 | Chang |
| 2003/0124999 A1 | 7/2003 | Parssinen |
| 2003/0193777 A1 | 10/2003 | Friedrich |
| 2003/0204759 A1 | 10/2003 | Singh |
| 2004/0003303 A1 | 1/2004 | Oehler |
| 2004/0051397 A1 | 3/2004 | Juntunen |
| 2004/0064745 A1 | 4/2004 | Kadambi |
| 2004/0163001 A1 | 8/2004 | Bodas |
| 2004/0167732 A1 | 8/2004 | Spitaels |
| 2004/0267897 A1 | 12/2004 | Hill |
| 2005/0102539 A1 | 5/2005 | Hepner |
| 2005/0143865 A1 | 6/2005 | Gardner |
| 2005/0223090 A1 | 10/2005 | Ewing |
| 2005/0283624 A1 | 12/2005 | Kumar |
| 2006/0005057 A1 | 1/2006 | Nalawadi |
| 2006/0013070 A1 | 1/2006 | Holm |
| 2006/0072271 A1 | 4/2006 | Jones |
| 2006/0085854 A1 | 4/2006 | Agrawal |
| 2006/0103504 A1 | 5/2006 | Vassallo |
| 2006/0112286 A1 | 5/2006 | Whalley |
| 2006/0168975 A1 | 8/2006 | Malone |
| 2006/0171538 A1 | 8/2006 | Larson et al. |
| 2006/0184935 A1 | 8/2006 | Abels |
| 2006/0184936 A1 | 8/2006 | Abels |
| 2006/0184937 A1 | 8/2006 | Abels |
| 2006/0259621 A1 | 11/2006 | Ranganathan |
| 2006/0265192 A1 | 11/2006 | Turicchi |
| 2006/0288241 A1 | 12/2006 | Felter |
| 2007/0010916 A1 | 1/2007 | Rodgers |
| 2007/0019626 A1 | 1/2007 | Lahiri |
| 2007/0038414 A1 | 2/2007 | Rasmussen |
| 2007/0040582 A1 | 2/2007 | Gross |
| 2007/0078635 A1 | 4/2007 | Rasmussen |
| 2007/0136453 A1 | 6/2007 | Ewing |
| 2007/0150215 A1 | 6/2007 | Spitaels |
| 2007/0180117 A1 | 8/2007 | Matsumoto |
| 2007/0240006 A1 | 10/2007 | Fung |
| 2007/0245165 A1 | 10/2007 | Fung |
| 2007/0260897 A1 | 11/2007 | Cochran |
| 2007/0273208 A1 | 11/2007 | Menas |
| 2008/0052145 A1 | 2/2008 | Kaplan |
| 2008/0148075 A1 | 6/2008 | Reder |
| 2008/0170471 A1* | 7/2008 | Rolet et al. ............ 367/127 |
| 2008/0238404 A1 | 10/2008 | Ferguson |
| 2008/0244281 A1 | 10/2008 | Felter |
| 2008/0270077 A1 | 10/2008 | Ozonat |
| 2008/0317021 A1 | 12/2008 | Ives |
| 2009/0207694 A1* | 8/2009 | Guigne et al. .......... 367/127 |
| 2009/0234512 A1 | 9/2009 | Ewing |
| 2009/0262604 A1 | 10/2009 | Funada |
| 2010/0214873 A1* | 8/2010 | Somasundaram et al. ...... 367/99 |

FOREIGN PATENT DOCUMENTS

| | | |
|---|---|---|
| GB | 2423168 A | 8/2006 |
| GB | 2437846 | 11/2007 |
| JP | 05-250188 | 9/1993 |
| JP | 6221649 | 8/1994 |
| JP | 2001337157 | 12/2001 |
| JP | 2003288236 | 10/2003 |
| JP | 2005069892 | 3/2005 |
| JP | 2005198364 | 7/2005 |
| JP | 2005323438 | 11/2005 |
| JP | 2006025474 | 1/2006 |
| JP | 2007139523 | 6/2007 |
| JP | 2007299624 | 11/2007 |
| WO | 2004074983 | 9/2004 |
| WO | 2006/089905 | 8/2006 |
| WO | 2006119248 | 11/2006 |
| WO | 2007072458 | 1/2007 |
| WO | 2007021392 | 2/2007 |
| WO | 2007024403 | 3/2007 |
| WO | WO 2010048205 A1 * | 4/2010 |

OTHER PUBLICATIONS

The International Search Report and Written Opinion by the International Search Authority, issued on Aug. 7, 2008, in the related PCT application No. PCT/US08/05533.

The International Search Report and Written Opinion by the International Search Authority, issued on Sep. 8, 2008, in the related PCT application No. PCT/US08/69422.

The International Search Report and Written Opinion by the International Search Authority, issued on Apr. 21, 2009, in the related PCT application No. PCT/US09/36299.

The International Search Report and Written Opinion by the International Search Authority, issued on Nov. 25, 2009, in the related PCT application No. PCT/US09/61521.

Office Action mailed on Nov. 3, 2010 in related U.S. Appl. No. 12/044,530.

Office Action mailed on Mar. 7, 2011 in related U.S. Appl. No. 12/168,504.

The extended European Search Report by the European Patent Office, issued on Jan. 16, 2012, in the corresponding European patent application No. 09716608.6.

The extended European Search Report by the European Patent Office, issued on Aug. 2, 2012, in the related European patent application No. 09822648.3.

Office Action, mailed on Jun. 28, 2011, in related U.S. Appl. No. 12/044,530.

Office Actions, mailed on Jun. 16, 2011 and Feb. 23, 2012, in related U.S. Appl. No. 12/112,435.

Office Action, mailed on Feb. 28, 2012, in related U.S. Appl. No. 12/168,504.

Moore et al., "Weatherman: Automated, online, and predictive thermal mapping and management for data centers," Jan. 1, 2006, Autonomic Computing, 2006. ICAC '06. IEEE International Conference on Dublin, Ireland, Jun. 13-16, 2006.

Raghavendra et al., "No 'Power' Struggles: Coordinated Multi-level Power Management for the Data Center," http://www.hpl.hp.com/echreports/2007/HPL-2007-194.pdf, Mar. 1, 2008.

Office Actions, mailed on Dec. 13, 2011 and Sep. 14, 2012, in related U.S. Appl. No. 12/603,322.

The Chinese Office Action, issued on Nov. 5, 2012, in the related Chinese Patent Application No. 200980142324.6.

The Chinese Office Action, issued on Apr. 26, 2013, in the related Chinese Patent Application No. 200980149075.3.

The Chinese Office Action, issued on Jan. 14, 2013, in the related Chinese Patent Application No. 200880131103.4.

The Chinese Office Action, issued on Feb. 16, 2013, in the related Chinese Patent Application No. 200880129788.9.

Office Action, mailed on Nov. 16, 2012, in related U.S. Appl. No. 12/112,435.

Office Actions, mailed on Jul. 17, 2013, in related U.S. Appl. No. 12/112,435.

Office Actions, mailed on Dec. 10, 2012, in related U.S. Appl. No. 12/603,322.

Office Actions, mailed on Apr. 19, 2013, in related U.S. Appl. No. 13/790,601.

The English translation of the Japanese Office Action issued on Jun. 18, 2013 in the related Japanese application No. 2011-533304.

The Japanese Office Action issued on Aug. 15, 2003 in related Japanese Application No. 2011-532336.

The Australian Office Action mailed on Mar. 22, 2013 in related Australian Application No. 2008359227.

(56) References Cited

OTHER PUBLICATIONS

Office Actions, mailed on Aug. 20, 2013 and Oct. 22, 2013, in related U.S. Appl. No. 12/044,530.
Office Action, mailed on Nov. 12, 2013, in related U.S. Appl. No. 12/112,435.
Office Action, mailed on Aug. 29, 2013, in related U.S. Appl. No. 12/168,504.
The Chinese Office Action, issued on Dec. 11, 2013, in the related Chinese Patent Application No. 200980142324.6.

* cited by examiner

SYSTEM AND METHOD FOR AUTOMATIC DETERMINATION OF THE PHYSICAL LOCATION OF DATA CENTER EQUIPMENT

CROSS-REFERENCED TO RELATED APPLICATIONS

This application claims priority from Provisional Patent Application No. 61/106,900 filed Oct. 20, 2008. This application also is related to U.S. patent application Ser. No. 12/112,435, entitled, "System and Method for Efficient Association of a Power Outlet and Device," filed on Apr. 30, 2008, and to U.S. patent application Ser. No. 12/168,504, entitled, "Automatic Discovery Of Physical Connectivity Between Power Outlets And It Equipment", filed on Jul. 7, 2008, both of which are assigned to the same assignee, and which are incorporated herein by reference in their entireties.

FIELD OF THE INVENTION

The invention relates generally to the field of data center management and more specifically to systems and methods for automatic discovery of the physical location of data center equipment.

BACKGROUND OF THE INVENTION

Modern data centers and IT infrastructures undergo frequent changes due to routine maintenance, upgrades and the like. In some cases existing equipment is removed for repair or replacement. In other cases existing equipment is relocated to a new position within an equipment rack or can be relocated to a different equipment rack. In other cases, new equipment may be added to one or more equipment racks. Most data centers maintain at least some form of map as to the physical location of each piece of equipment (e.g., servers, network hardware, routers, switches, gateways and the like). Such maps are typically updated manually by data center personnel. The manual nature of traditional data center configuration monitoring makes real time visualization and monitoring of the date center extremely difficult. It would be desirable to provide systems and methods for automatic discovery of the physical location of data center equipment such that manual configuration monitoring is not required.

By automating manual data center configuration monitoring, organizations benefit from real time visibility into the operation of data center equipment. This can simplify the maintenance and upgrade process and can also be beneficial when combined with Intelligent power distribution systems, devices and methods.

BRIEF SUMMARY OF THE INVENTION

The invention is directed to a system and method for automatic discovery of the physical location of at least one device in a data center. Each device to be tested or discovered (and ultimately included in the map of the data center) has an associated ultrasonic emitter. The system generally includes a set of ultrasonic transducers (detectors) having known locations in the data center. For purposes of this disclosure, the term "known location" can be either an absolute location or a relative location. For example, transducers or sets of transducers can be positioned relative to a specific equipment rack or landmark in the data center. A controller initiates the generation of an ultrasonic signal from the ultrasonic transducer (in this case operated as an emitter) associated with the device under test. Time of arrival circuitry generates time of arrival information associated with each ultrasonic detector based on the time of receipt of the ultrasonic signal at each transducer in the set of transducers (operated as detectors). The controller determines the relative location of the device under test based on the known location of the ultrasonic detectors within the data center and the time of arrival information associated with each ultrasonic detector.

In one embodiment at least two ultrasonic transducers are housed in a transducer module. In another embodiment the transducer module can also include power distribution circuitry. In yet another embodiment the transducer module can also include environmental monitoring circuitry.

A variety of ultrasonic transducers can be utilized, for example a speaker (emitter) The controller can be located in the transducer module or remotely from the transducer module. The time of arrival circuitry can be located in the transducer module or remotely from the transducer module. The time of arrival circuitry can be implemented using a variety of hardware/software solutions. For example, the time of arrival circuitry can include at least one counter. In the alternative, the time of arrival circuitry can utilize the phase difference between the ultrasonic signal received from at least two detectors.

The data center can include multiple devices each having an associated ultrasonic emitter that can generate an ultrasonic signal. The controller can generate a map of the data center based on the time of arrival information derived from the ultrasonic signal generated by each ultrasonic emitter. The map can contain text and/or graphics and can generally include the relative location of each device having an associated ultrasonic emitter. The ultrasonic signal can be encoded with data representing a variety parameters such as device serial number, device model number, device status and the like.

The map can includes not only relative locations but also the data decoded from an encoded ultrasonic signal (e.g., device serial number, device model number, device status and the like). The system can optionally include one or more supplemental transducers tied to at least one landmark in the data center. The map can also include the relative location of each supplemental transducer. The map can also be formatted with absolute locations of each device. The absolute locations can be derived from the relative locations of each device in cases where the absolute location of at least one landmark in the data center is known.

The system can also include a second set of ultrasonic transducers having known locations in the data center and a second controller associated with the second set of ultrasonic transducers. In this case, second time of arrival circuitry can be used to generate time of arrival information based on the time of receipt of the ultrasonic signal at each ultrasonic transducer in the second set of ultrasonic transducers. In this scenario, the first set of ultrasonic detectors can be utilized to generate ultrasonic signals. The second controller can then determine the relative location of each of the transducers in the first set of transducers based on the known location of the second set of ultrasonic transducers within the data center and the time of arrival information associated with each ultrasonic transducer in the second set of ultrasonic transducers.

BRIEF DESCRIPTION OF THE DRAWINGS

For a better understanding of the present invention, reference is made to the following description and accompanying drawings, while the scope of the invention is set forth in the appended claims:

DETAILED DESCRIPTION OF THE INVENTION

The invention is directed to systems and methods for automatic discovery of the physical location of data center equipment. It is to be understood that the figures and descriptions of the present invention have been simplified to illustrate elements that are relevant for a clear understanding of the present invention, while eliminating, for the purposes of clarity, many other elements found in typical systems and methods. Those of ordinary skill in the art will recognize that other elements may be desirable and/or required in order to implement the present invention. However, because such elements are well known in the art, and because they do not facilitate a better understanding of the present invention, a discussion of such elements is not provided herein.

I. System Overview

Figure 1:
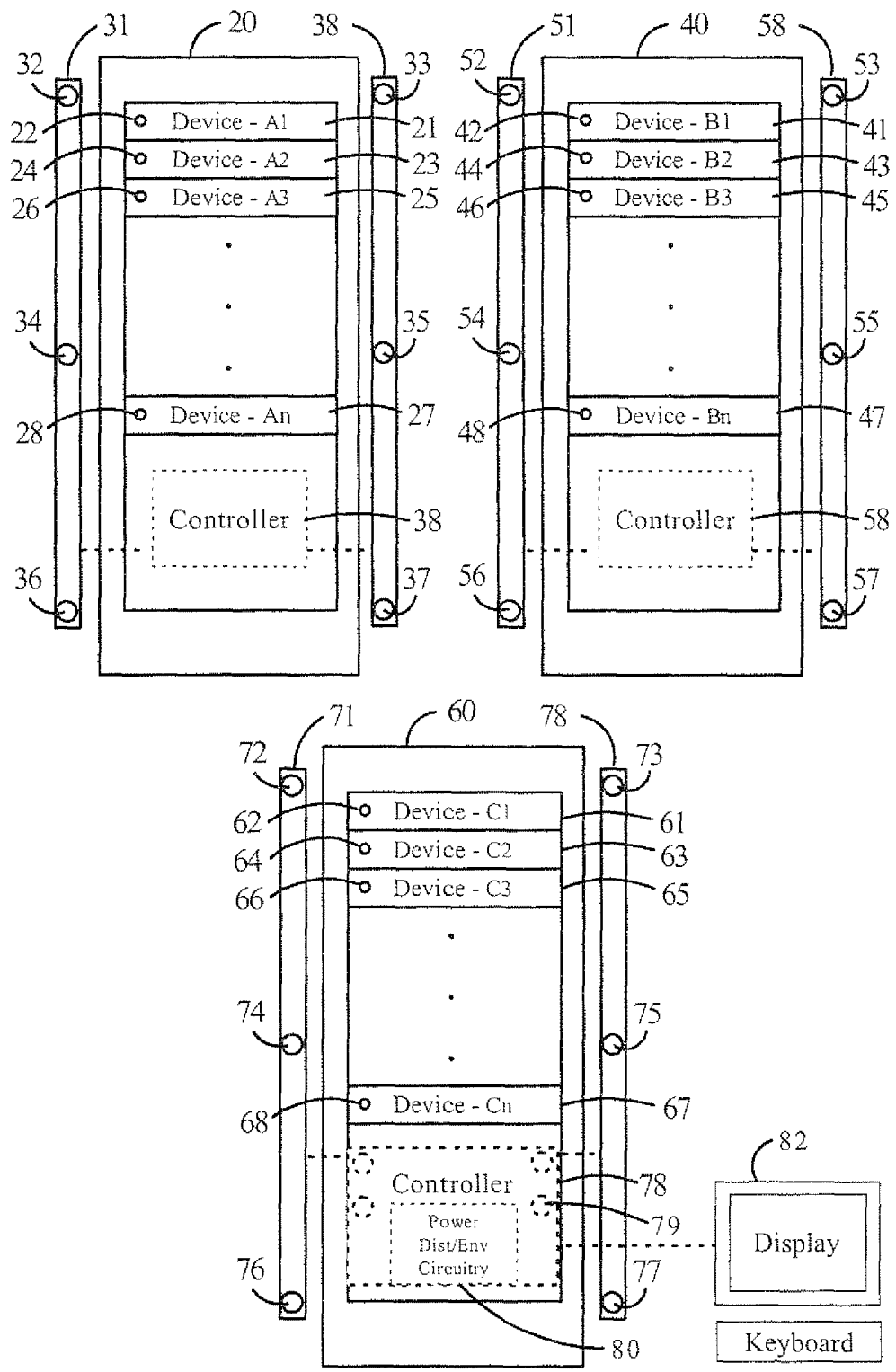
FIG. 1 is a block diagram of an exemplary data center in accordance with the invention.

The invention is directed to systems and methods for automatic discovery of the location of data center equipment. The physical location of data center equipment is determined by utilizing ultrasound transducers and triangulation or sound ranging techniques as discussed in detail below. FIG. 1 shows an exemplary data center in accordance with the invention. The term "data center" is used herein in its broadest sense and generally refers to an area for storing or housing computer systems and associated equipment, such as telecommunications and data storage systems. In its simplest form a data center can include a few pieces of equipment. In a more complex form a data center can include numerous components including redundant or backup power supplies, redundant data communications connections, environmental controls (e.g., air conditioning, fire suppression), power distribution equipment, environment monitoring equipment (e.g., temperature, humidity) and security devices.

Referring to FIG. 1, the data center generally has one or more equipment racks (e.g., 20, 40 and 60). Each rack is populated with one or more pieces of equipment (devices). In this example rack 20 is populated with devices 21, 23, 25 and 27. Similarly rack 40 is populated with devices 41, 43, 45 and 47 and rack 60 is populated with devices 61, 63, 65 and 67. Each device includes at least one ultrasonic transducer operable to emit an ultrasonic signal (e.g., a pulse or burst of ultrasonic energy). For matters of simplicity, such transducers may be referred to herein as ultrasonic emitters or simply emitters. It is understood that an emitter in accordance with the invention can optionally include ultrasonic detection capabilities as well. Similarly, an ultrasonic detector in accordance with the invention can optionally include ultrasonic emission capabilities.

In rack 20, each of the devices 21, 23, 25 and 27 has at least one associated ultrasonic emitter labeled 22, 24, 26 and 28 respectively. Similarly rack 40 includes devices 41, 43, 45, 46 having associated ultrasonic emitters 42, 44, 46, 48 respectively and rack 60 includes devices 61, 63, 65, 66 having associated ultrasonic emitters 62, 64, 66, 68 respectively. In their simplest form, such ultrasonic emitters can comprise an audio speaker (such as an existing speaker that is integrated in a server or other piece of data center equipment) which are often capable of generating sound energy at the lower end of the ultrasonic spectrum (e.g., 20 khz). In the alternative a suitable ultrasonic transducer (e.g., piezoelectric or EMAT based) can be selected from a variety of well known sources. Such transducers can also be selected based on a pre-defined beamwidth and/or filter processing capabilities. It is also understood that a variety of ultrasonic frequencies can be utilized without departing from the scope of the invention. It is further understood that such signals can be simple wave forms (e.g., square waves) or they can be coded or modulated. For example, each device fitted with a transducer can be configured to transmit a coded ultrasound burst with one or more of the following: the unit model number, the unit serial number, status information or the like. This information can be decoded upon receipt and then utilized to supplement the relative location information.

Each rack is also associated with one or more controllers shown generally by blocks 38, 58 and 78 and discussed in more detail below. The controller is generally coupled to one or more transducers operable to detect ultrasonic energy. For matters of simplicity, such transducers may be referred to herein as ultrasonic detectors or simply detectors. It is understood that detectors in accordance with the invention can optionally include ultrasonic emission capabilities as well. Again, suitable ultrasonic detectors (e.g., piezoelectric, EMAT or the like) can be selected from a variety of well known sources. In this example, the detectors are grouped into modules shown generally by blocks 31, 38, 51, 58, 71 and 78. The transducer modules (detector modules) can include multiple detectors. For example detector module 31 includes ultrasonic detectors (transducers) 32, 34 and 36. The connection between the controller and the various detector modules is shown generally in dashed lines. Depending on the specific implementation, this connection can be wired or wireless as discussed below. It is understood that a single controller can be associated with multiple detectors. For example, a data center can utilize a single controller in association with all of its associated detectors. In the alternative, multiple controllers can be utilized (e.g., one controller per rack, one controller per detector module or other variations). The controller can be implemented using convention PC hardware and software. The controller may be implemented with one or more digital processors, microcontrollers or the like. Such processors can be employed to carry out the more timing sensitive aspects of the invention (e.g., time of arrival measurements) as discussed below. The controller will typically include input/output devices such a keyboard, mouse, display and a user interface as is well known in the computer art. The controller can include network hardware (e.g., wired and/or wireless) and can be coupled to a data network and/or the Internet. It is also understood that a variety of detector and controller configurations can be utilized without departing from the scope of the invention.

The controller can be separated from or integrated into the detector module. It is also possible to combine the controller and/or detector module with existing data center equipment. For example, ultrasonic detectors and/or controllers can be integrated into power management equipment such as the DOMINION PX remote power management devices available from Raritan, Inc. of Somerset, N.J. Such remote power management devices are designed for integration with typical data center equipment racks and are available in a variety of configurations (e.g., Zero U, 1U, 2U). In the current example, racks 20 and 40 are equipped with Zero U configuration detector modules. It is understood that these module can include various levels of power distribution functionality (e.g., a plurality of electrical outlets, outlet level power switching, temperature and humidity sensing, power measurement capabilities and the like, see e.g., block 80). In this example, the detector modules include several ultrasonic detectors that are spaced apart by known distances and angular displacements. Rack 60 is shown with an alternative controller configuration 78 (e.g., a 2U configuration) including one or more ultrasonic transducers 79. It is understood that controller 78 can be used in conjunction with or in addition to the Zero U detector modules (e.g., 71 and 78).

II. System Operation

The invention utilizes ultrasonic transducers and triangulation or sound ranging techniques to determine the physical location of data center equipment. In a typical scenario, the system will determine the relative position of a given device with respect to the various detectors, other devices, equipment rack positions or the like. For example, the system may determine that a given device is generally located closer a first detector as compared to a second detector. Similarly, the system may determine that a first device is generally located above a second device in a given rack. In general, the system will utilize all available information to synthesize the best possible map of the physical location of all devices having ultrasound emitters. The resulting map can be output by conventional means such as a computer display 82 coupled to the controller, hard copy or the like. Maps can also be distributed via a data network, email or the like. In cases where the absolute location of at least one landmark in the data center is known, the system can convert the relative locations to absolute locations (e.g., longitude and latitude) using known techniques.

Figure 6:
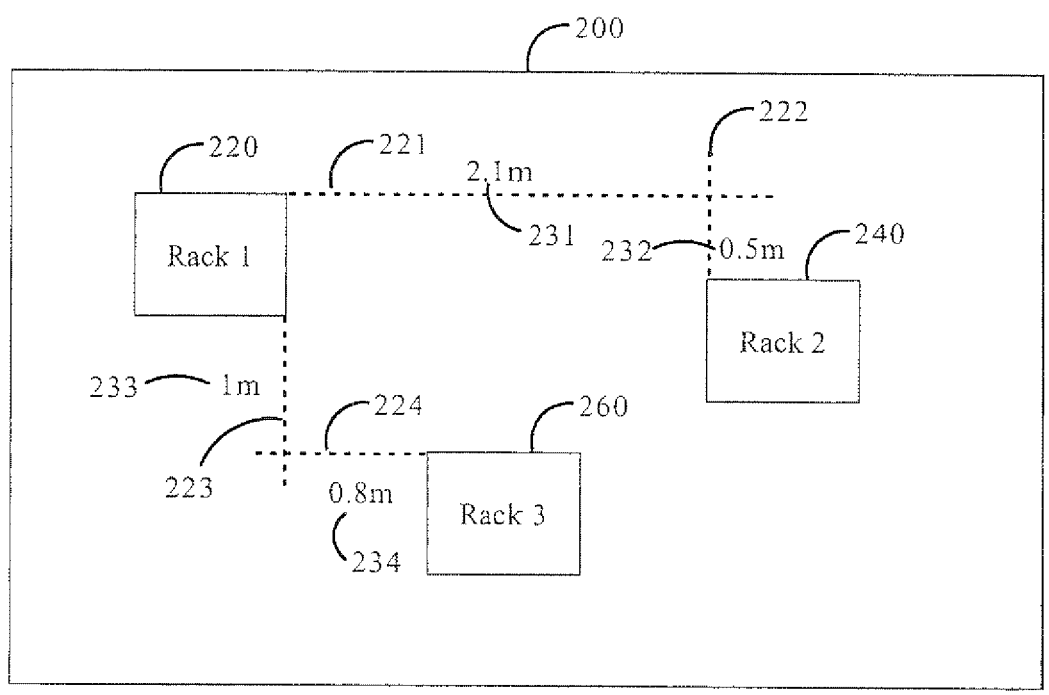
FIG. 6 is an exemplary graphical map in accordance with the invention.

It is understood that a topological map in accordance with the invention can include text, graphics or a combination thereof. The map may also include information that is decoded from the ultrasound burst. FIG. 6 shows an exemplary topological map 200 in accordance with the invention. In this example, the data center has three equipment racks shown graphically by blocks 220, 240, 260. The map can also include the relative distance between the racks as shown by dashed lines 221, 222, 223, 234. The map can also include distance labels 231, 232, 233, 234 to show the relative location of each of the equipment racks in the data center. It is understood that supplemental transducers can be attached to the data center walls, partitions, or other landmarks thereby allowing the system to determine the relative location of the various equipment racks and devices with respect to those landmarks.

Figure 7:
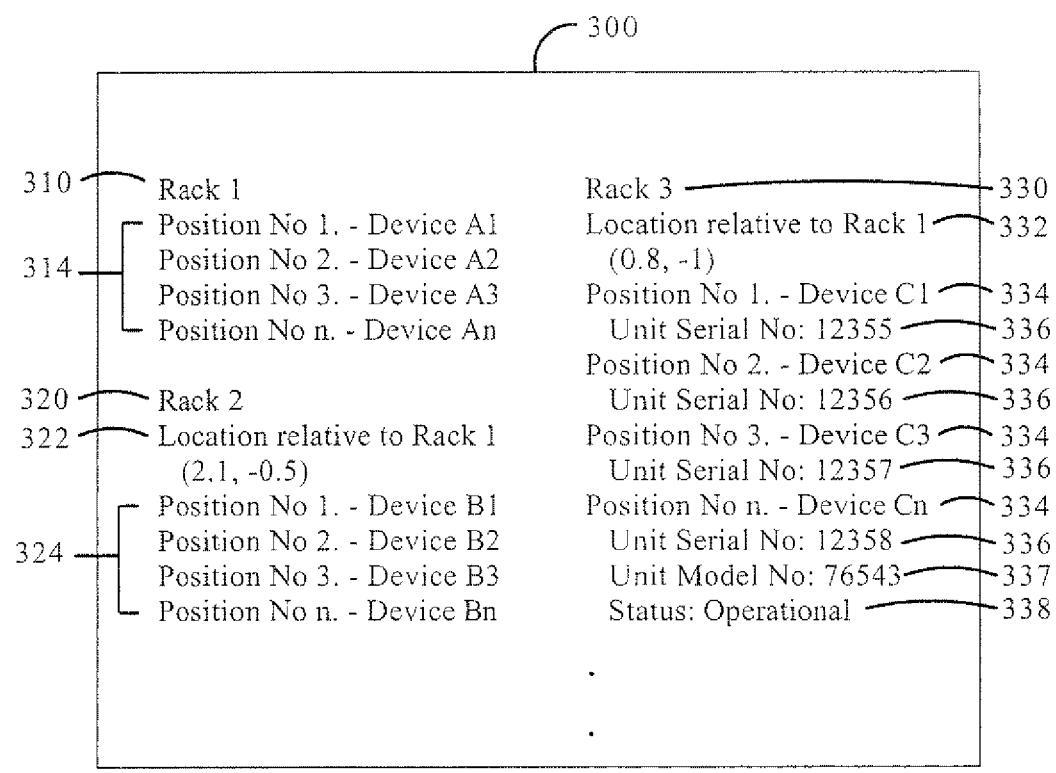
FIG. 7 is an exemplary text based map in accordance with the invention.

FIG. 7 shows an example of a text based map 300 in accordance with the invention. The map can generally identify each equipment rack as shown by reference numbers 310, 320 and 330. The map can also show the devices associated with each equipment rack (i.e., the devices installed in the rack) as shown by reference numbers 314, 324 and 334. The map can also provide the relative locations of each device and rack as shown by reference numbers 322 and 332. In cases where the ultrasound burst is encoded with data, this information may also be displayed. In this example, the devices in rack 3 utilized ultrasound bursts that were encoded with the serial number, model number and status of the device. This is shown graphically by reference numbers 336, 337 and 338. In this example, the location of Racks 2 and 3 are reported relative to Rack 1 using Cartesian coordinates in two dimensions. It is understood that the relative locations can also be reported in three dimensions. It is understood that a variety of coordinate systems and/or notations could be used without departing from the scope of the invention (e.g., polar coordinates, cylindrical coordinates, spherical coordinates . . . ). It is also understood that the relative coordinates can be converted into actual physical coordinates based on the location of one or more landmarks in the data center. For example, the user can supply the location of data center walls and the location of the one of the equipment racks within the data center. Based on this information, the system can identify the location of each rack and its associated devices using known techniques. It is also understood that any of the information discussed above in connection with text based maps can also be incorporated into a graphical map as discussed in connection with FIG. 6.

Figure 2A:
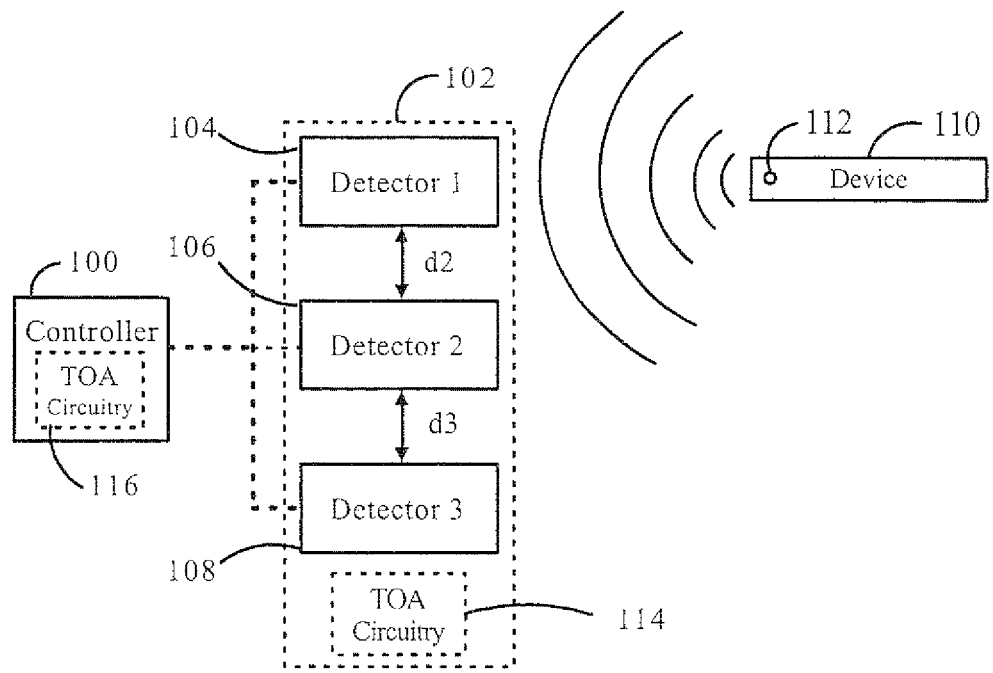
FIG. 2a shows an exemplary high level block diagram illustrating basic system operation in accordance with the invention.

Basic system operation is shown in FIG. 2a. The system utilizes a controller 100 and several ultrasonic detectors. In this example, a single detector module 102 is shown with three detectors 104, 106 and 108. Each device for which position information is to be determined includes an ultrasonic emitter. In this example, only a single device 110 with emitter 112 is shown for purposes of clarity. Assume for purposes of this example that device 110 is at an unknown location in a data center. Also assume for this example that the detectors have a known spacing (shown graphically as d2 and d3). Each of the detectors 104, 106 and 108 are operable to simultaneously receive ultrasonic signals. The emitter 112 is then activated so as to generate an ultrasonic signal. The resulting ultrasonic signal is then detected by detectors 104, 106 and 108.

Figure 2B:
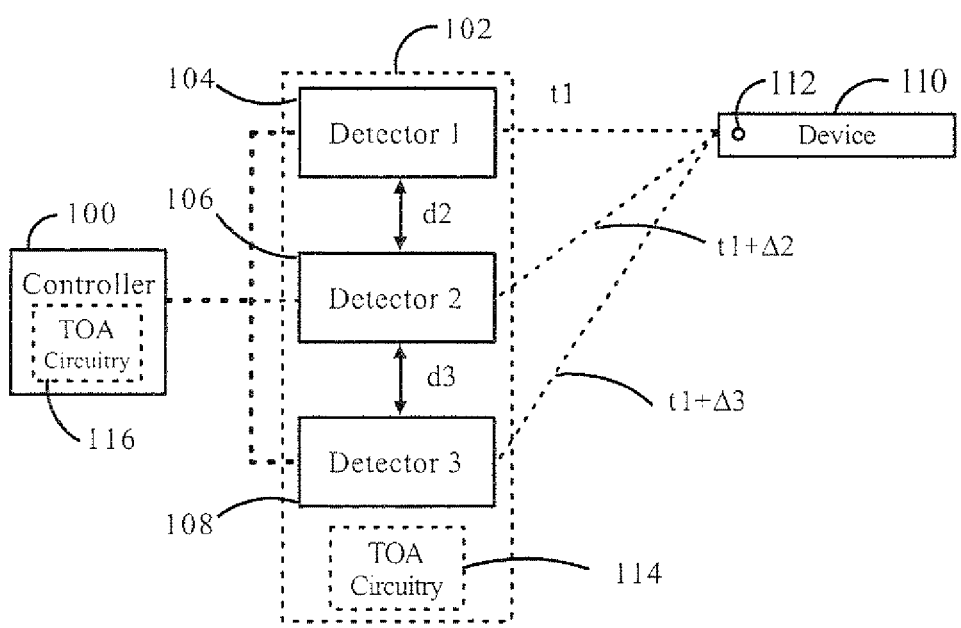
FIG. 2b shows an exemplary high level block diagram illustrating basic system operation in accordance with the invention.

Referring to FIG. 2b, emitter 112 is shown generally operating as a point source. Depending on the physical location of the device, the path lengths between device 110 and each of the detectors 104, 106 and 108 may be different. These differences will result in a different time of arrival (i.e., the time of detection of an ultrasonic signal) for each detector. In the current example, the device 110 is closest to detector 102. For purpose of this discussion, the time of arrival at detector 1 is labeled t1. The time of arrival at detector 2 is $t1+\Delta 2$, the time of arrival at detector 3 is $t1+\Delta 3$. In this case the $\Delta 2$ and $\Delta 3$ represent the increased time delay for the sound the travel to each of the associated detectors 106 and 108. These time delays can be mathematically translated into distances as discussed below.

It is generally know that in dry air with a temperature of 21° C. the speed of sound is 344 m/s. Utilizing the time of arrival information, the speed of sound and the basic geometry of the detector locations (e.g., the known distance between the various detectors, angular displacements and the like), the system can generally determine the location of the device in question relative to the detectors. It is understood that the system can compensate for variations in the speed of sound based on environmental factors (e.g., temperature and humidity).

Figure 3:
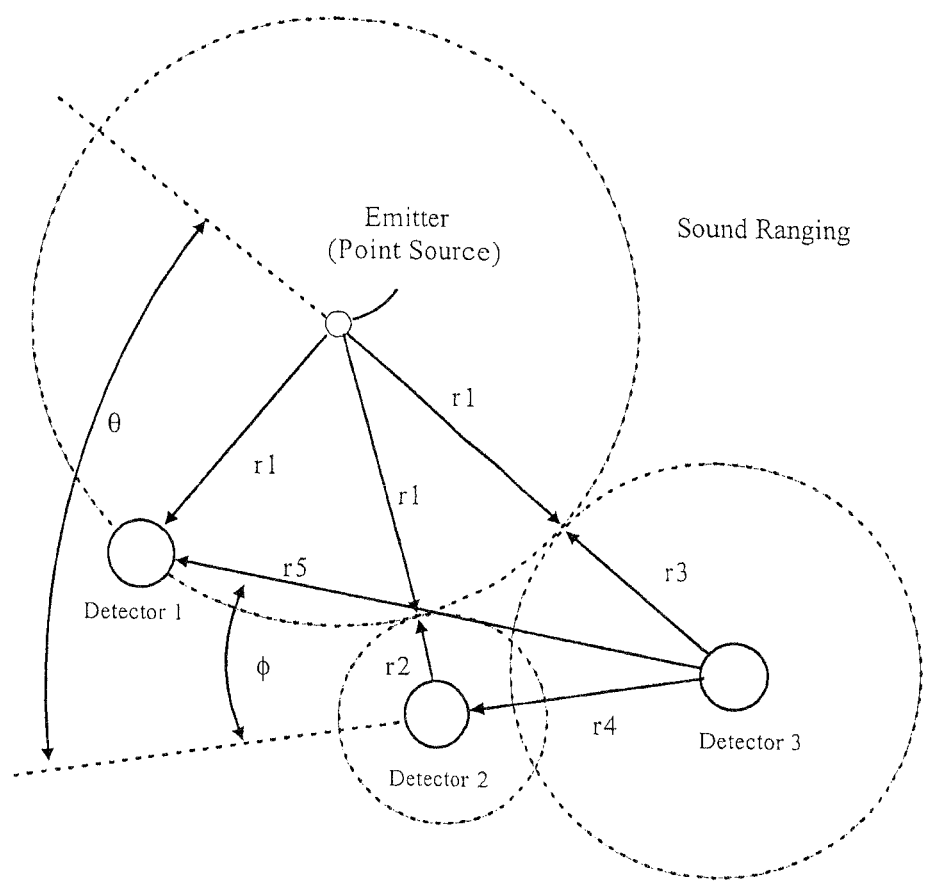
FIG. 3 shows an exemplary diagram illustrating sound ranging techniques for a conventional sound location system.

A variety of techniques such as triangulation or sound ranging can be utilized to determine the location of a device under test. Sound ranging generally uses pairs of detectors to produce a bearing to the emitter. The intersection of these bearings gives the location of the emitter. The bearings are derived from the differences in the time of arrival at the detectors. For example, FIG. 3 shows an exemplary drawing with the basic geometry of a location system. Assume for purposes of this example:

the distance from detector 1 to detector 3 is known (r5),
the distance from 2 to detector 3 is known (r4), and
the angles between detectors are known (Θ, Ø).

Based on these known distance and angular values, there are a number of ways to determine the basic location of the emitter. One way is to apply the law of cosines several times. Other techniques utilize the law of sines. Typically the system will develop a set of simultaneous equations and solve for the unknowns. Based on the discussion contained herein, it is well within the scope of those skilled in the art to implement the invention utilizing known mathematical techniques. An example of such mathematical techniques is found in the paper "A Synthesizable VHDL Model of the Exact Solution for Three-dimensional Hyperbolic Positioning System" by Ralph Bucher and D. Misra, VLSI Design, 2002 Vol. 15 (2), pp. 507-520.

An important aspect of the system is the measurement of the times of arrival (TOA) or the time delays between the various times of arrivals at the detector. Measurement of this system parameter can be accomplished via a variety of techniques including but not limited to high speed counter circuitry and phase difference techniques. In general, since the speed of sound in air is approximately 344 m/s a high speed counter clocked in the megahertz range can provide adequate resolution. For example, assume that the path length between an emitter and two different detectors differs by 0.01 meters. The time of arrival difference between such detectors would be 0.01/344~30 μs. A 1 Mhz counter produces bursts with a 1 μs resolution and a 10 Mhz counter will produce bursts with a 0.1 μs resolution. Thus, it is readily apparent that a suitable clock rate can be determined based on the desired resolution of the system. Similarly, phase correlation techniques can be utilized since the ultrasonic signal received by the various detectors will vary in phase depending on the spacing between the emitter and the detectors. TOA circuitry operable to determine time of arrival and/or TOA delays at the various detectors on any of the various known techniques is well within the grasp of those skilled in the art.

It is understood that the TOA or TOA differences can be measured locally or remotely. This is shown graphically by blocks 114 and 116 in FIGS. 2a and 2b. Local measurement can be carried out by embedding the TOA circuitry adjacent to the detector or within the detector module. For example, each of the detector modules can be instrumented with the necessary circuitry to determine the first detector to sense an ultrasonic signal and the time differences between the TOA for each of the other detectors in the module (collectively time of arrival information). The module can them simply communicate this information to the controller once the information is compiled. In the local scenario, the timing of the communication between the detector module and the controller is not critical since the high speed timing measurements are carried out at the detector or module. Thus communication between the module and the controller can be carried out via conventional wired or wireless communication.

In the alternative, the controller can via hardware and/or can remotely determine the first detector to sense an ultrasonic signal and the time differences between the TOA for each of the other detectors. In this scenario it may be necessary to provide equal length signal paths to each detector module. The configuration of such remote measurement hardware/software is well within the scope of those skilled in the art.

Figure 5:
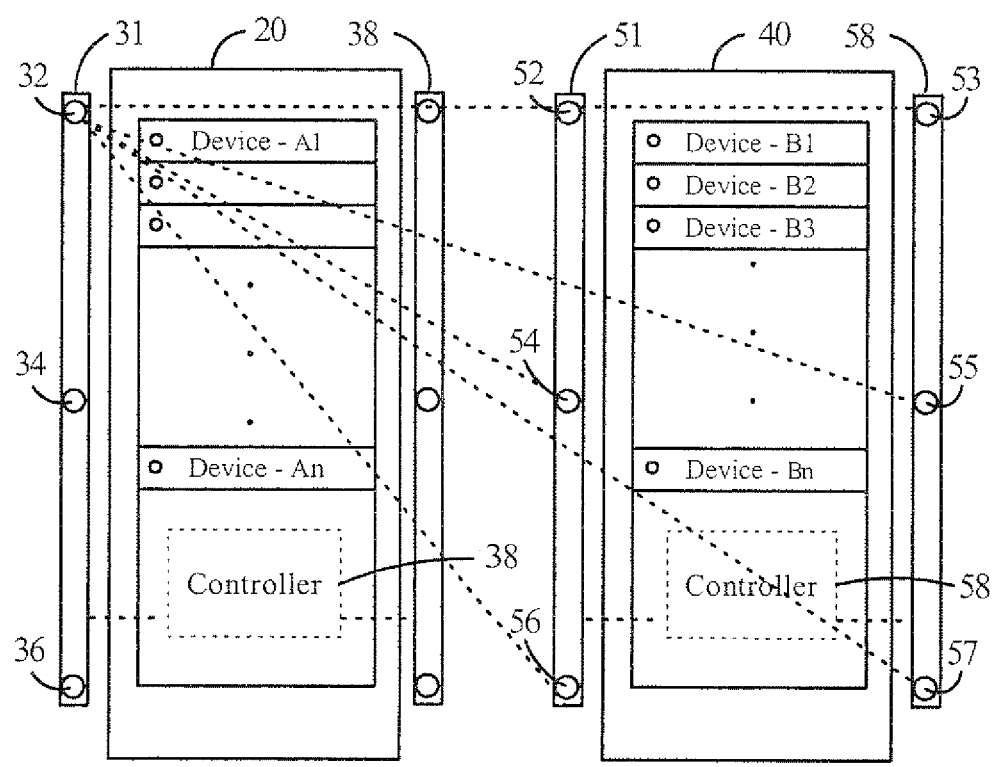
FIG. 5 is a block diagram of an exemplary data center showing sound ranging used in connection with the transducer modules.

In configurations having multiple equipment racks it is also possible to perform sound ranging to determine the relative location of each equipment rack. This embodiment of the invention provides enhanced capability to determine and/or verify the overall topology of the data center (e.g., the location of the detector modules as well as other devices), to track any changes. FIG. 5 is a diagram of an exemplary data center showing sound ranging used in connection with the detector modules (i.e., certain transducers in the detector modules are used as emitters). In this particular example, the data center has two equipment racks 20, 40. Each equipment rack is associated with a controller 38, 85 respectively. Each controller is associated with a pair of detector modules 31, 38 and 52, 58 respectively. Each detector module includes one or more sets of transducers. In this example, transducer 32 is utilized to emit a burst of ultrasonic energy (shown in dashed lines). Transducers (detectors) 52-56 are utilized to detect the ultrasonic burst. As discussed above, the TOA differences between the transducers 52-56 can be used to determine the relative location of transducer 32.

Figure 4:
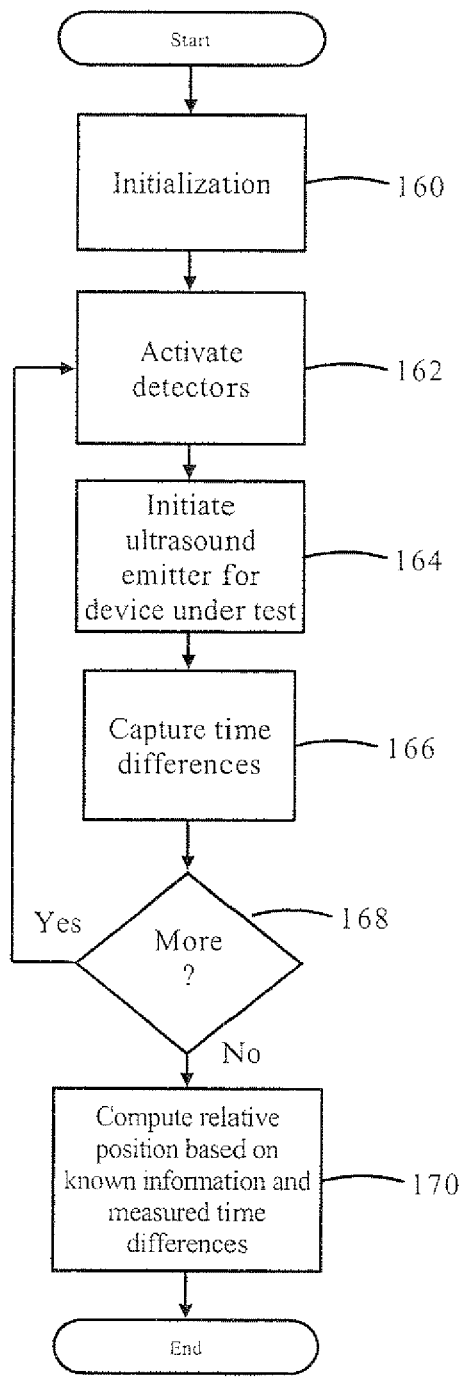
FIG. 4 is an exemplary flowchart showing system operation in accordance with the invention.

FIG. 4 shows an exemplary flowchart detailing system operation in accordance with the invention. It is understood that the order of execution can be varied without departing from the scope of the invention. It is also understood that the flowcharts contained herein are illustrative only and that other program entry and exit points, time out functions, error checking routines and the like (not shown) would normally be implemented in typical system software. It is also understood that some of the individual blocks may be implemented as part of an iterative process. It is also understood that the system software can be implemented to run continuously, at periodic intervals or at manually selected timings. Accordingly any beginning and ending blocks are intended only to indicate logical beginning and ending points for purposes of this disclosure.

In general, system operation begins with initialization as shown by block 102. Initialization can include loading of data such as known system parameters and the like. A set of detectors is then activated so that they can detect ultrasonic signals as shown by block 162. A given device is selected and an ultrasound burst is generated using its associated emitter. In a typical scenario, the device at issue will be PC based and the ultrasound burst is generated via the PC speaker. The ultrasound burst can be initiated via a variety of known software for controlling PC speaker operation. For example, the console of the device can be accessed via a typical terminal or console server. At the console level, a command can be issued to initiate an audio or ultrasound burst. For example, the echo −e "/a" command will result in the generation of a beep from a typical PC speaker (−e=enable interpretation of backslash escapes, and "/a"=alert or BEL). There are a variety of available programs that can alter the frequency of the tone generated by a PC speaker. It is also known to alter the PC system timers associated with PC speaker tone generation. Based on the foregoing, it is well within the grasp of those skilled in the art to set the PC speaker frequency to the lower end of the ultrasonic range and generate a burst in accordance with the invention. It is also understood that each device can be equipped with an ultrasonic transducer that can addressed or activated by a variety known methods.

Once the ultrasonic burst is generated the detectors receive the burst and the TOA circuitry determines the first detector to receive the burst. The TOA differences between the various detectors can also be determined as shown by block 166. This process is repeated for each device at issue, as shown by block 168. Once all of the TOA information is captured, the system can then utilized the known information and TOA information to determine the relative location of each device in the data center as shown by block 170. It is understood that TOA information can be gathered from each device in the data center. In cases where there are multiple controllers with associated sets of transducers, one or more of the transducers from each set can be energized so as to emit ultrasonic energy. One or more of the remaining controllers can configured to detect ultrasonic bursts and can perform sound ranging to determine the relative location of the transducers under test.

While the foregoing description and drawings represent the exemplary embodiments of the present invention, it will be understood that various changes and modifications may be made without departing from the scope of the present invention.

What is claimed is:

1. A system for automatic discovery of the physical location of at least one device in a data center, the system including multiple devices each having an associated ultrasonic emitter that generates an ultrasonic signal, the system comprising:
a first set of ultrasonic transducers having known locations in the data center,
a first controller associated with the first set of ultrasonic transducers wherein the first controller initiates the generation of the ultrasonic signal from the ultrasonic emitter associated with the device,
time of arrival circuitry that generates time of arrival information based on the time of receipt of the ultrasonic signal at each ultrasonic transducer in the first set of ultrasonic transducers,
wherein the first controller determines the relative location of the device based on the known location of the first set of ultrasonic transducers within the data center and the time of arrival information associated with each ultrasonic transducer in the first set of ultrasonic transducers,
wherein the first controller is operable to generate a map of the location of the device in the data center based on the time of arrival information derived from the ultrasonic signal generated by each ultrasonic emitter, and
wherein the first controller is further ca able to decode the ultrasonic signal to retrieve data representing at least one of a device serial number, a device model number and a device status.

2. The system of claim 1 wherein at least two ultrasonic transducers in the first set of transducers are housed in a transducer module.

3. The system of claim 2 wherein the transducer module also includes power distribution circuitry.

4. The system of claim 2 wherein the transducer module also includes environmental monitoring circuitry.

5. The system of claim 1 wherein the ultrasonic emitter is a speaker.

6. The system of claim 2 wherein the first controller is located in the transducer module.

7. The system of claim 2 wherein the first controller is located remotely from the transducer module.

8. The system of claim 2 wherein the time of arrival circuitry is located in the transducer module.

9. The system of claim 2 wherein the time of arrival circuitry is located remotely from the transducer module.

10. The system of claim 1 wherein the time of arrival circuitry comprises at least one counter.

11. The system of claim 1 wherein the time of arrival circuitry utilizes the phase difference between the ultrasonic signal received from at least two detectors.

12. The system of claim 1 wherein the map contains at least one of text and graphics wherein the map includes the relative location of each device having an associated ultrasonic emitter.

13. The system of claim 1 wherein the map contains at least one of text and graphics and wherein map contains at least one of the device serial number, the device model number and the device status derived from the encoded ultrasonic signal.

14. The system of claim 1 comprising at least one supplemental transducer tied to at least one landmark in the data center.

15. The system of claim 14 wherein the map contains the relative location of the at least one supplemental transducer.

16. The system of claim 1 wherein the map contains absolute locations of each of the multiple devices having an associated ultrasonic emitter, the absolute locations being derived from the relative locations of each device.

17. The system of claim 1 comprising:
a second set of ultrasonic transducers having known locations in the data center,
a second controller associated with the second set of ultrasonic transducers
second time of arrival circuitry that generates time of arrival information based on the time of receipt of the ultrasonic signal at each ultrasonic transducer in the second set of ultrasonic transducers,
wherein the first set of ultrasonic detectors are utilized to generate ultrasonic signals, and wherein the second controller determines the relative location of each of the transducers in the first set of transducers based on the known location of the second set of ultrasonic transducers within the data center and the time of arrival information associated with each ultrasonic transducer in the second set of ultrasonic transducers.

18. A method for automatic discovery of the physical location of at least one device in the data center, the device having an associated ultrasonic emitter, with a first set of ultrasonic transducers having known locations in the data center, the method comprising the steps of:
activating the first set of ultrasonic transducers having known locations in the data center to receive ultrasonic signals,
emitting an ultrasonic signal from the associated ultrasonic emitter of the at least one device, wherein the ultrasonic signal is encoded with data representing at least one of a device serial number, a device model number and a device status,
receiving the ultrasonic signal from the associated emitter of the at least one device by the first set of ultrasonic transducers,
decoding the ultrasonic signal to retrieve data representing at least one of a device serial number, a device model number and a device status,
capturing the time of arrival information based on the receipt of the ultrasonic signal from the associated ultrasonic emitter by the first set of ultrasonic transducers, and
computing the position of the at least one device based on the time of arrival information and the known location of the first set of ultrasonic transducers.

19. The method of claim 18, wherein the data center includes multiple devices each having an associated ultrasonic emitter, further comprising:
deactivating the first set of ultrasonic transducers,
repeating activating, emitting, receiving, capturing, and computing for each of the at least one devices in the data center having an associated ultrasonic emitter.

20. The method of claim 19, further comprising generating a map of the positions of each of the at least one devices in the data center based on computing the position of each of the at least one device.

21. The method of claim 20, wherein at least one transducer is associated with the at least one landmark in the data center.

22. The method of claim 21, further comprising converting the positions of each of the at least one device to an absolute position based on the absolute location of at least one landmark.

23. The method of claim 20, wherein the map contains at least one of text and graphics.

24. The method of claim 18, further comprising:
encoding data in the ultrasonic signal.

25. The method of claim 24, further comprising generating a map of the positions of each of the at least one devices of the data center based on computing the positions of each of the least one devices wherein the map contains at least one of a device serial number, device model number and device status derived from the encoded ultrasonic signal.

26. The method of 18, wherein the computing the position of the at least one device is performed by a first controller.

\* \* \* \* \*